(12) United States Patent
Evans, Jr. et al.

(10) Patent No.: US 7,672,151 B1
(45) Date of Patent: Mar. 2, 2010

(54) METHOD FOR READING NON-VOLATILE FERROELECTRIC CAPACITOR MEMORY CELL

(75) Inventors: Joseph T. Evans, Jr., Albuquerque, NM (US); William D. Miller, Rio Rancho, NM (US); Richard H. Womack, Albuquerque, NM (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 07/377,168

(22) Filed: Jul. 10, 1989

Related U.S. Application Data

(62) Division of application No. 07/057,100, filed on Jun. 2, 1987, now abandoned.

(51) Int. Cl.
G11C 7/00 (2006.01)
G11C 11/22 (2006.01)

(52) U.S. Cl. .................. 365/145; 365/149; 365/189.15; 365/189.16; 365/222

(58) Field of Classification Search .................. 365/145, 365/149, 222, 189.01, 189.07; 357/51
See application file for complete search history.

(56) References Cited

U.S. PATENT DOCUMENTS

| | | | |
|---|---|---|---|
| 2,839,739 A | 6/1958 | Anderson et al. |
| 2,859,428 A | 11/1958 | Young |
| 2,872,661 A | 2/1959 | Young |
| 2,876,436 A | 3/1959 | Anderson |
| 2,884,618 A | 4/1959 | Epstein |
| 2,938,194 A | 5/1960 | Anderson |
| 3,002,182 A | 9/1961 | Anderson |
| 3,018,412 A | 1/1962 | Asars |
| 3,100,887 A | 8/1963 | Wolfe |
| 3,183,490 A | 5/1965 | Cubbage |
| 3,264,618 A | 8/1966 | Wanlass et al. |
| 3,393,346 A | 7/1968 | Lechner et al. |
| 3,401,378 A | 9/1968 | Bartlett et al. |
| 3,422,400 A | 1/1969 | Corijnen |
| 3,460,103 A | 8/1969 | Lewis |
| 3,510,852 A | 5/1970 | Bartlett et al. |

(Continued)

FOREIGN PATENT DOCUMENTS

CA 594910 3/1960

(Continued)

OTHER PUBLICATIONS

Ferroelectrics Storage Devices, Mertz et al. Bell Laboratories Record Sep. 1955.*

(Continued)

Primary Examiner—Reginald G Bragdon
(74) Attorney, Agent, or Firm—Davidson Berquist Jackson & Gowdey LLP

(57) ABSTRACT

A non-volatile memory cell and related system utilize ferroelectric capacitors as data storage elements. Circuitry is provided for writing to a single ferroelectric capacitor storage element, as well as to dual storage elements operating inversely. The storage elements are read by use of a sense amplifier in a configuration which automatically restores the original data states, thereby eliminating the need for a subsequent restore operation. Memory systems are described which include circuitry for driving bit lines, word lines and drive lines to accomplish both the write and read operations.

20 Claims, 13 Drawing Sheets

U.S. PATENT DOCUMENTS

| | | | |
|---|---|---|---|
| 3,537,079 | A | 10/1970 | Feisel |
| 3,681,765 | A | 8/1972 | Chapman |
| 3,832,700 | A | 8/1974 | Wu et al. |
| 4,144,591 | A | 3/1979 | Brody |
| 4,161,038 | A | 7/1979 | Wu |
| 4,164,751 | A | 8/1979 | Tasch |
| 4,195,355 | A | 3/1980 | Rohrer |
| 4,408,303 | A | 10/1983 | Guterman et al. |
| 4,477,886 | A | 10/1984 | Au |
| 4,491,936 | A * | 1/1985 | Eaton, Jr. et al. ............ 365/149 |
| 4,498,154 | A | 2/1985 | Hoffmann |
| 4,506,351 | A | 3/1985 | Scheuerlein et al. |
| 4,536,785 | A | 8/1985 | Gibbons |
| 4,809,225 | A * | 2/1989 | Dimmler et al. ............ 365/145 |
| 4,853,893 | A * | 8/1989 | Eaton, Jr. et al. ............ 365/145 |
| 4,860,254 | A | 8/1989 | Pott et al. |
| 4,873,664 | A * | 10/1989 | Eaton, Jr. ..................... 365/145 |

FOREIGN PATENT DOCUMENTS

| | | |
|---|---|---|
| DE | 2754987 | 6/1978 |
| EP | 0293798 | 7/1988 |
| GB | 829210 | 3/1960 |
| GB | 1544314 | 4/1979 |
| IT | 533328 | 9/1955 |
| IT | 534535 | 10/1955 |
| JP | 52-71140 | 6/1977 |
| JP | 61-34790 | 2/1986 |
| JP | 61-229350 | 10/1986 |
| WO | WO 86/04447 | 7/1986 |

OTHER PUBLICATIONS

Ferroelectric Storage Devices, Mertz et al., Bell Labs Record, Sep. 1955.
Hybrid Volatile/NonVolatile Integrated Memory Arrays, IBM Tech. Disclosure Bulletin, vol. 18, No. 5, Oct. 1975.
IDS filed May 2, 1990 in U.S. Appl. No. 07/443,018.
Supplemental IDS Filed Jul. 1, 1991 in U.S. Appl. No. 07/443,018.
English translation (with translation certification) of file history of Japanese Patent Appln. No. S63-30712 [12 pages].
English translation (with translation certification) of Introduction to VLSI; Ohta, K.; pp. 135-143, Jan. 1983 (ISBN 4-274-02973-5).
English translation (with translation certification) of Japanese Publication No. S52-71140, published Jun. 14, 1977.
English translation (with translation certification) of Japanese Publication No. S61-229350, published Oct. 13, 1986.
English translation (with translation certification) of Opposition No. 72310 of 1998, Patent No. 2674775 patent opposition filing in the Japanese Patent Office (more than one document in packet).
File history of Japanese Patent Appln. No. S63-30712 [11 pages].
Opposition No. 72310 of 1998, Patent No. 2674775 patent opposition filing in the Japanese Patent Office (more than one document in packet).
Alvin B. Kaufman, "An Expandable Ferroelectric Random Access Memory," IEEE Trans. on Computers (1973) pp. 154-158.
H. H. Chao, "Static RAM with Nonvolatile Backup Memory," IBM Technical Disclosure Bulletin, vol. 24, No. 5, Oct. 1981, pp. 2456-2457.
Howard C. Kirsch et al., "Megabit DRAMs," 1985 IEEE International Solid-State Circuits Conference Proceedings, Feb. 15, 1985, Coral Gables, FL, pp. 256-258.
T. M. Sullivan, "Hybrid Volatile/Nonvolatile Integrated Memory Arrays," IBM Technical Disclosure Bulletin, vol. 18, No. 5, Oct. 1975, pp. 1540-1541.
Translation of Notice of Reasons for Revocation to Japanese counterpart to U.S. Patent No. 4,873,664 (5 pages).
W. I. Kinney et al., "A Non-Volatile Memory Cell based on Ferroelectric Storage Capacitors," International Electron Devices Meeting (IEDM) Technical Digest, Washington, DC, Dec. 6-9, 1987, pp. 850-851.
Decision on Opposition to Japanese counterpart to U.S. Patent No. 4,873,664 (14 pages) (translation).
European Search Report for EP 87 31 0930 counterpart to U.S. Patent No. 4,873,664.
Introduction to VLSI; Ohta, K.; pp. 135-143, Jan. 1983 (ISBN 4-274-02973- 5).
Kirsch et al., 1 Mb CMOS DRAM, ISSCC 85, Feb. 15, 1985 (3 pgs).
Koike et al., A 60 ns 1 Mb Nonvolatile Ferroelectric Memory with Non-Driven Cell Plate Line Write/Read Scheme (Slide Supplement), ISSCC96, Feb. 1996.
Koike et al., A 60 ns 1 Mb Nonvolatile Ferroelectric Memory with Non-Driven Cell Plate Line Write/Read Scheme, ISSCC96, Feb. 1996.
Mason, W.; Fifty Years of Ferroelectricity; J. of Acoustical Soc. of Amer.; vol. 50, No. 5 (Part 2), Nov. 1971.
One-Device Cells for Dynamic Randon-Access Memories: A Tutorial; Rideout, V.L.; IEEE Trans. on Electron Dev., Jun. 1979.
Opposition to Japanese Counterpart to U.S. Patent No, 4,873,664 (24 pages).
Rejection in Australian counterpart application to US Pat. No. 4,874,664 dated Jun. 9, 1988.
Rejection in EP87310930 dated Apr. 23, 1993.
Rejection in EP87310930 dated Jun. 2, 1992.

* cited by examiner

METHOD FOR READING NON-VOLATILE FERROELECTRIC CAPACITOR MEMORY CELL

This is a division of application Ser. No. 07/057,100, filed Jun. 2, 1987 now abandoned.

TECHNICAL FIELD

The present invention pertains in general to integrated circuit memories and in particular to such memories having non-volatile storage.

BACKGROUND OF THE INVENTION

Integrated circuit memories have come into extensive use in many applications, particularly for computer systems. It has been a pronounced technological trend to increase the capacity and density of such memories. As manufacturing and design techniques have improved, the cost of memory circuits has decreased dramatically, and this has greatly expanded the number of applications and the size of the market. However, the low cost, large capacity integrated circuits now in use have volatile memory storage, that is, the data stored in these memories is lost when the power is removed. There are many applications that could be enhanced if low cost memories could be made which are non-volatile. In certain applications, it is essential that the data be retained in the memory when power is removed. To fill this market, there have been developed a number of types of non-volatile memories. Among the most common of these now in use is the electronically programmable read only memory (EPROM). However, the non-volatile memories now available typically have a rather low density of memory storage, are generally complex to manufacture, often have a limited lifetime and are much more expensive than volatile memories. The need for non-volatile memory storage in integrated circuits has long been recognized, but a low cost solution has not yet been found.

The phenomenon of ferroelectric materials has been recognized and studied for many years. Such materials have multiple orientation states which can be selected by the application of an electric field. The particular orientation state which is set in a ferroelectric material can be used to represent a data state. This orientation state is retained even when no further power is applied to the material. It is thus possible to store a particular state in a non-powered device and then to read the data state at a later time. It has long been recognized that ferroelectric materials could serve as a memory element in an electrical circuit. An early recognition of this application is shown in U.S. Pat. No. 2,695,396 to Anderson. Since the Anderson patent, there have been more disclosures of circuitry which utilize ferroelectric elements from memory storage. Such patents include U.S. Pat. Nos. 4,144,591 to Brody, 4,149,301 to Cook and 4,360,896 to Brody. Still other patents report circuits which use ferroelectric materials in a memory. But, despite the numerous references to reports of ferroelectric memory devices, there has to date been no known device of this type which has been introduced into the commercial market. The demand for non-volatile memories is well recognized and the apparent applicability of ferroelectric materials and the fabrication of such devices have been reported. But, numerous problems have been experienced in both the manufacture and design of practical ferroelectric devices.

The present invention sets forth a circuit design for a ferroelectric memory which takes advantage of the non-volatile characteristics of such memory elements, while providing fast, reliable writing and reading of data for such circuits.

SUMMARY OF THE INVENTION

A selected embodiment of the present invention comprises a non-volatile memory circuit which includes a ferroelectric capacitor which selectively stores first and second polarization states therein. An access transistor provides a series connection to the ferroelectric capacitor upon receipt of a selection signal for the memory circuit. Circuitry is provided which includes drive lines and bit lines connected through the access transistor to the terminals of the capacitor. The access transistor is turned on to establish a series connection of the capacitor and transistor between the drive and bit lines. The circuitry applies a first voltage state and a second, opposite polarity, voltage state to the ferroelectric capacitor for producing respectively the first and second polarization states in the ferroelectric capacitor. This is a write function for the memory circuit. The circuitry further applies a pulse to the drive line for producing a data signal at the bit line corresponding to the polarization state stored in the ferroelectric capacitor, thereby providing a read function for the memory circuit.

A further embodiment of the present invention is a method for writing a given data state into a non-volatile memory cell through a series of steps. The first step comprises selecting a memory cell by activating an access transistor to connect a ferroelectric capacitor between a drive line and a bit line. A drive signal having a predetermined voltage state is applied through the drive line to a first terminal of the ferroelectric capacitor. Concurrently, a data signal having one of a plurality of voltage states is applied through the bit line to a second terminal of the ferroelectric capacitor, wherein the difference between the drive signal voltage and the data signal voltage applies a given polarization state to the ferroelectric capacitor, whereby the polarization state is stored in the capacitor and corresponds to the given data state. Lastly, the access transistor is deactivated to isolate the ferroelectric capacitor.

A still further embodiment of the present invention is a method for reading a stored data state from a ferroelectric capacitor memory circuit. An access transistor connects the ferroelectric capacitor serially between a drive line and a bit line. A drive pulse is applied through the drive line to the ferroelectric capacitor to apply a predetermined electric field across the ferroelectric capacitor. The quantity of charge transferred to the bit line depends upon the polarization state previously set in the ferroelectric capacitor. The voltage charge on the bit line is compared to a reference voltage, or to differential charge from a second ferroelectric capacitor to produce a data state which corresponds to the stored polarization state.

A still further aspect of the present invention is that during a read operation, which is destructive, the original polarization state is restored without the need for a subsequent write operation to the memory cell.

DESCRIPTION OF THE DRAWINGS

For a more complete understanding of the present invention and the advantages thereof, reference is now made to the following Detailed Description taken in conjunction with the following Drawings in which.

DETAILED DESCRIPTION OF THE INVENTION

The present invention utilizes a ferroelectric capacitor as a non-volatile storage element in an electronic memory. It has been well established that ferroelectric capacitors can be set to have first and second opposite polarization states. Such operation with a ferroelectric capacitor is shown in U.S. Pat. Nos. 2,695,396, 3,155,833 and 4,360,896. It has been found that a ferroelectric ceramic material having a designation PLZT is suitable for use in accordance with the present invention. PLZT is a perovskite crystal made up of lead, lanthanum, zirconium and titanium. This ferroelectric material can be produced as described in U.S. Pat. No. 4,946,710 entitled Method for Preparing PLZT and PZT Sol-Gels and Fabricating Ferroelectric Thin Films. A further description of ferroelectric materials is in "Sol-Gel Processing of $PbTiO_3$, $PbZrO_3$, PZT, PLZT Thin Films", *Brit. Cer. Proc., Vol.* 36, 1985 pages 107-121 and "Preparation of Ferroelectric PZT Films by Thermal Decomposition of Organometallic Compounds", *Journal of Materials Science*, Vol. 19, 1984, pages 595-598.

Figure 1:
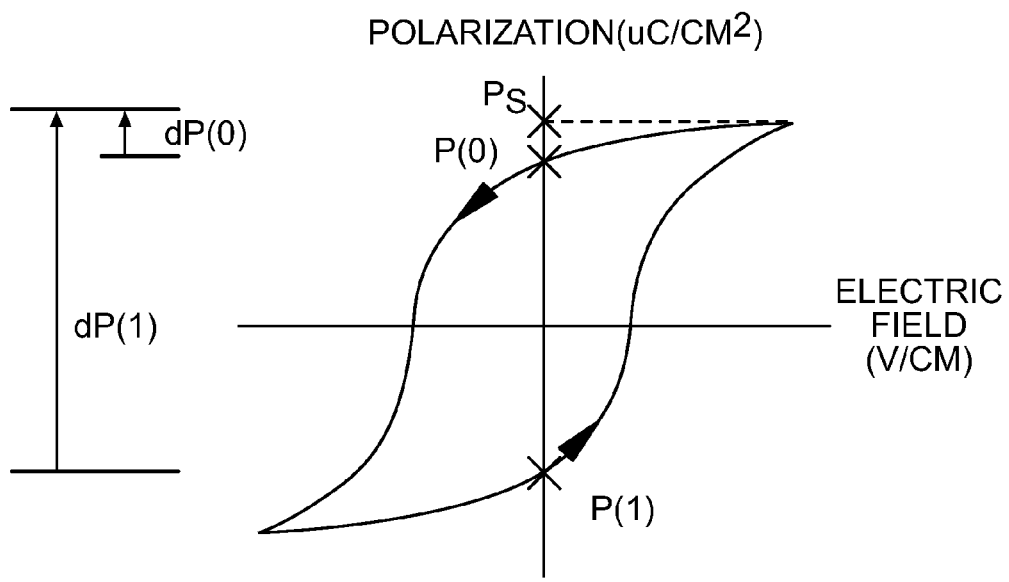
FIG. 1 is a hysteresis curve illustrating the polarization characteristics of a ferroelectric capacitor.

Referring now to FIG. 1 there is illustrated a hysteresis curve showing the polarization versus electric field for a ferroelectric capacitor. When a positive electric field is applied across the terminals of a ferroelectric capacitor, there is produced the polarization state indicated as Ps. As the electric field intensity decreases toward 0, the polarization is shown by the upper right side curve. When the electric field intensity decreases to 0, the polarization state is designated as P(0). This polarization state is arbitrarily defined to be a data 0. When the electric field intensity goes negative, the polarization of the capacitor is shown by the curve which extends through the upper left and lower left quadrants. As the negative electric field returns to 0, the hysteresis of the capacitor produces a polarization state P(1), which is negative polarization. This is arbitrarily defined to be a data 1 state. When a positive electric field is again applied to the terminals of the ferroelectric capacitor, the polarization is indicated by the curve extending through the lower right and upper right quadrants until the polarization state Ps is again reached. It can be seen that with alternating positive and negative polarity electric fields that the polarization will be indicated by traveling counterclockwise around the hysteresis curve as indicated by the arrows on the curve.

The polarization between the P(0) and P(1) points is termed remanent because it remains after the electric field is removed. The polarization between the Ps and P(0) points is termed non-remanent since it is lost when the electric field goes from a maximum to zero.

Figure 2:
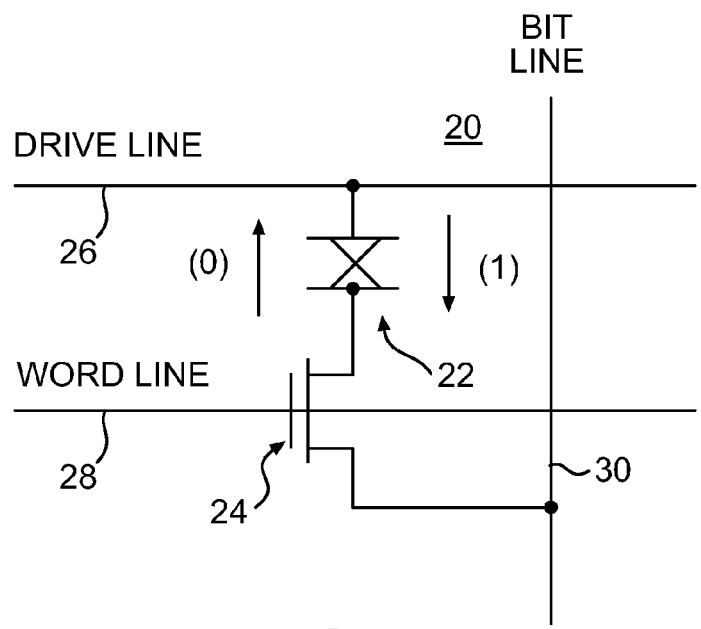
FIG. 2 is a single cell ferroelectric capacitor memory circuit in accordance with the present invention.

A memory cell circuit representative of the present invention is illustrated in FIG. 2. A memory circuit 20 includes a ferroelectric capacitor 22 and an access transistor 24. The ferroelectric capacitor 22 can be set to have a data 1 polarization state as indicated by the downward pointing arrow, which indicates a negative polarization state. It can further be set to have a data 0 state, which is indicated by the upward pointing arrow. Access transistor 24 is an MOS enhancement mode device which has the drain terminal thereof connected to one terminal of the ferroelectric capacitor 22. A second terminal of the capacitor 22 is connected to a drive line 26. The gate terminal of transistor 24 is connected to a word line 28 which receives a selection signal for selecting the memory circuit 20. The source terminal of transistor 24 is connected to a bit line 30 which transmits data states to and receives data states from the ferroelectric capacitor 22.

The physical configuration shown in FIG. 2 for circuit 20 has the bit line 30 perpendicular to the drive line 26 and the word line 28. Although the word line 28 is typically orthogonal to the bit line 30, the drive line 26 may be parallel to either of the lines 28 or 30. Further, the positions of the transistor 24 and capacitor 22 can be reversed.

Figure 3:
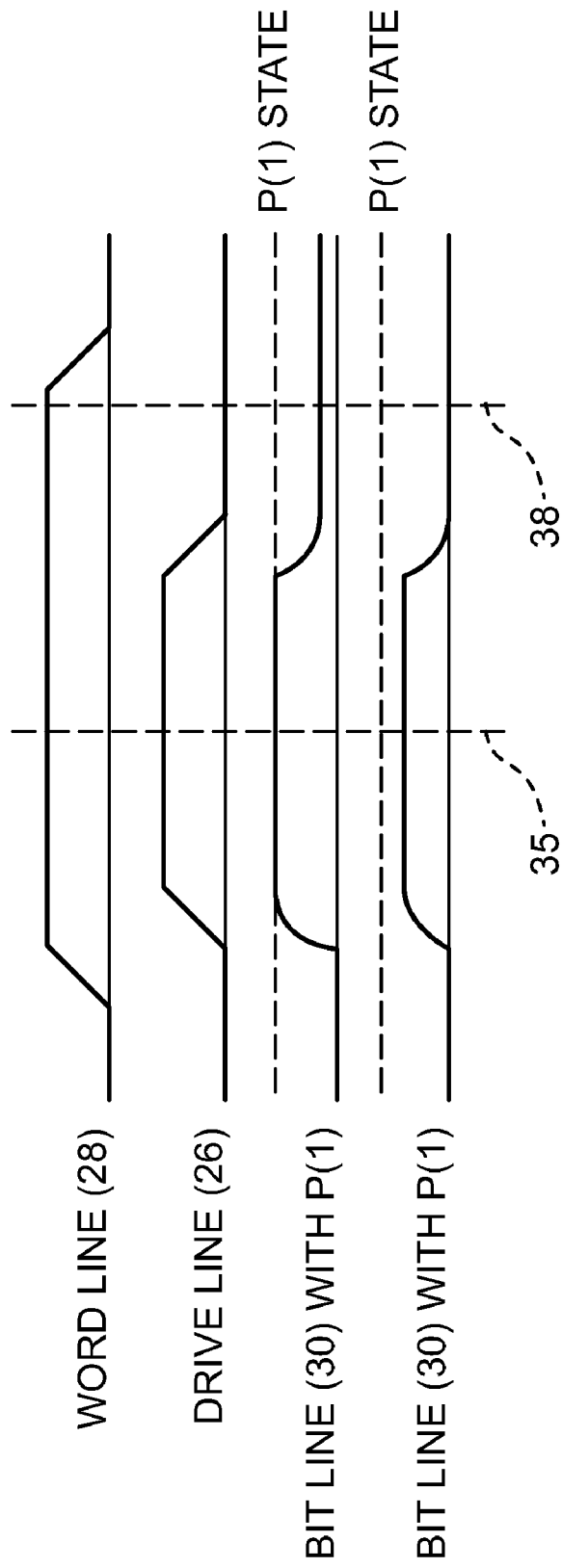
FIG. 3 is a set of waveforms illustrating the reading of data states for the memory circuit shown in FIG. 2.

The read operation for the circuit 22 is illustrated by the waveforms shown in FIG. 3. When the signal on the word line 28 is in a high state, the transistor 24 is turned on, thereby serially connecting the ferroelectric capacitor 22 between the drive line 26 and the bit line 30. After the word line has turned on the transistor 24, the drive line goes from 0 to a positive voltage state. When the capacitor 22 has previously been set to have a negative polarization state, data 1, the rising voltage on the drive line applies an electric field across the capacitor 22. Referring back to FIG. 1, this is a movement along the hysteresis curve from the point P(1) upward and to the right until the polarization of the capacitor is Ps. When the drive line voltage falls, the polarization follows the upper curve back to the point P(0). There is thus a net shift of current through the transistor 24 to the bit line 30. The bit line 30, in a typical integrated circuit configuration, has an inherent capacitance which is charged by the current flow through the capacitor 22. In an application where the bit line 30 has insufficient capacitance, a capacitor can be connected to it. Further referring to FIG. 3, it can be seen that when the ferroelectric capacitor is in the P(1) state initially and a positive going pulse is applied through the drive line 26 that there will be a net voltage remaining on the bit line 30 after the drive line pulse has returned to 0.

As a comparative reference, the P(1) polarization state is shown as a dotted line for each of the bit line waveforms.

When the ferroelectric capacitor 22 is in the P(0) state representing a data 0, and the positive drive pulse is applied, the polarization indicated in the hysteresis curve in FIG. 1 transitions from the P(0) point upward to the right until polarization is at the Ps point. When the drive line voltage falls, the polarization returns to P(0). There is no net change in polarization and therefore no current flow through the transistor 24. As a result, there is no charge transferred into the bit line 30. The temporary charging of the bit line 30 is due to the non-remanent polarization.

For convenience, the data 1 state has been defined to be a high level state following activation of the ferroelectric capacitor. This corresponds to the charge transferred to the bit line when the capacitor has been read. Likewise, the data 0 state corresponds to a low or zero voltage state after the capacitor has been read.

The operation of a sense amplifier in conjunction with the circuit 20 is further described below. Still referring to FIG. 3, the sense amplifier is activated at a particular time to read the bit line. It can be activated either during the time that the drive line 26 is active, as shown by the dotted line 35, or after the drive line pulse has returned to 0 as indicated by the line 38. By activating the sense amplifier at the time shown by line 35, during the period of the drive line pulse, the data in the memory cell is retrieved faster. However, by waiting until the drive line pulse has returned to zero, as indicated by line 38, the data retrieval is slower but the long-term reliability of the memory cell 20 may be increased due to a reduced wear-out mechanisms. Such a residual voltage can tend to reduce the lifetime of ferroelectric materials.

Figure 4:
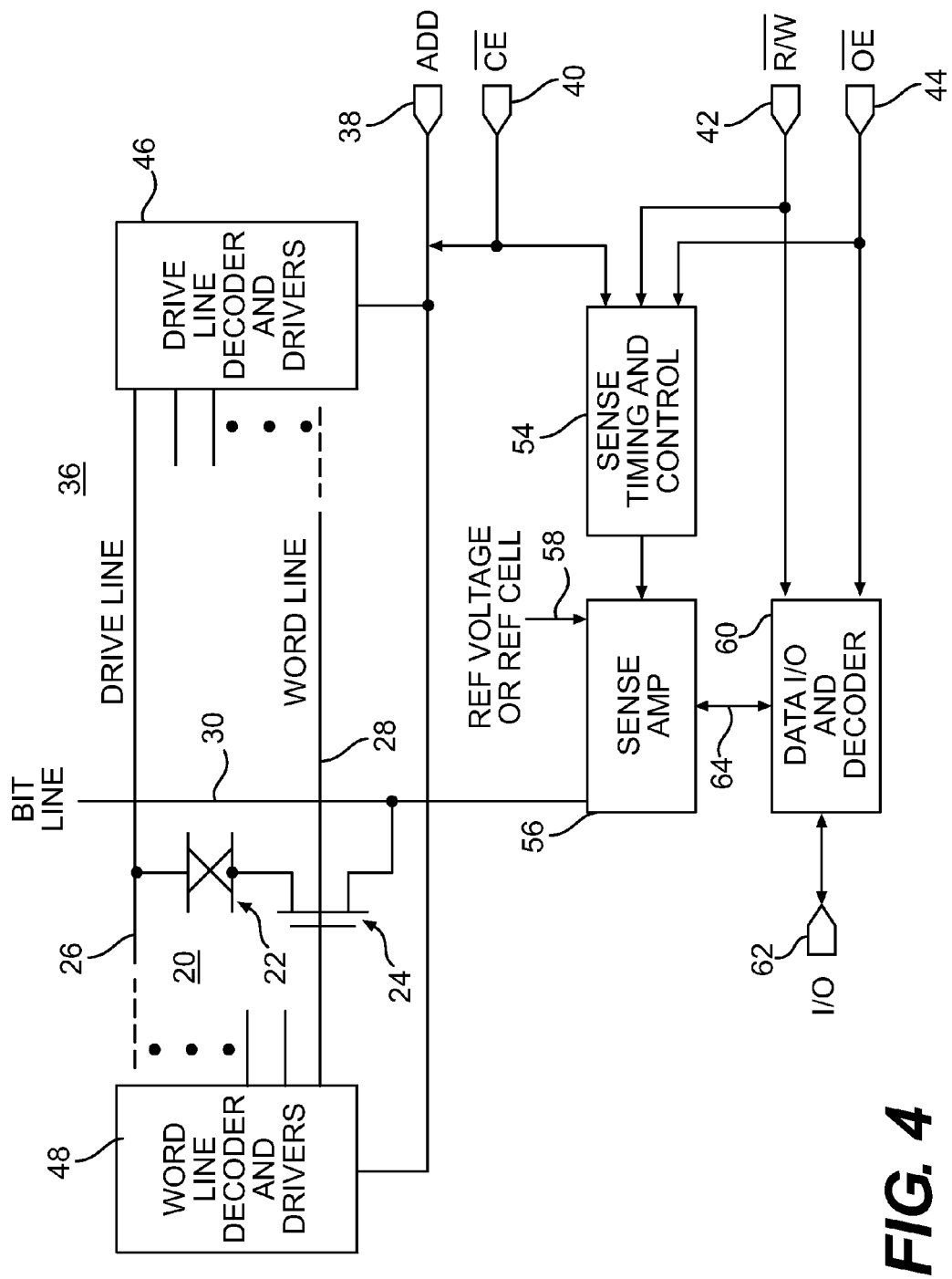
FIG. 4 is a memory system which includes a single cell ferroelectric capacitor memory circuit, together with the peripheral circuits required to write data into the memory cell and read data from the memory cell.

A memory system 36, which utilizes the single cell memory circuit 20, is illustrated in FIG. 4. The memory system 36 employs the circuit 20 and all common elements are identified by similar reference numerals. The address for a particular memory cell is received at an address terminal 38. This can be a parallel input. The memory system 36 is enabled by a chip enable signal shown by the symbol CE bar at a terminal 40. When the chip enable signal goes to a low state, the memory system 36 is enabled. The CE bar signal is also provided to the circuits 46 and 48. A read/write (R/W) bar command is input to the memory system 36 at a terminal 42. An output enable signal, shown as OE bar at terminal 44, provides the function of enabling the output from the system 36, that is, preparing the output to be read.

The address signal is input through terminal 38 to a drive line decoder and drivers circuit 46 and a word line decoder and drivers circuit 48. The circuit 46 generates the drive line signal at line 26, while the circuit 48 generates the word line signal at line 28.

The chip enable bar signal is input through the terminal 40 to a sense timing and control circuit 54 as well as to the circuits 46 and 48. Likewise, the read/write command signal at terminal 42 and the output enable command at terminal 44 are input to a sense timing and control circuit 54. The output from the sense timing and control circuit 54, is input to a sense amplifier 56, which also receives a reference voltage or reference cell input through a line 58. The sense amplifier 56 detects voltage states on the bit line 30 for read operations and generates required data states on line 30 for write operations.

The read/write signal is further transmitted through terminal 42 to a data input/output and decoder circuit 60. The output enable signal at terminal 44 is also input to the circuit 60. A data input and output terminal 62 is connected to the data input/output and decode circuit 60. Input data is transmitted through terminal 62 and output data from the memory cell 20 is received at terminal 62. The circuit 60 is connected to transfer data to and from the sense amplifier 56 through a line 64.

The input to line 58 can also be from a "dummy cell." This is a memory cell having the same architecture as other memory cells, such as cell 20, on the same column line, but having a different capacitor size. Dummy cells are well known in the field of dynamic random access memory circuits. The dummy cell is always maintained in the same state and is driven each time a memory cell is accessed on the same column line. The output of the dummy cell produces a reference having a level between the data outputs generated by the data memory cell.

Figure 5:
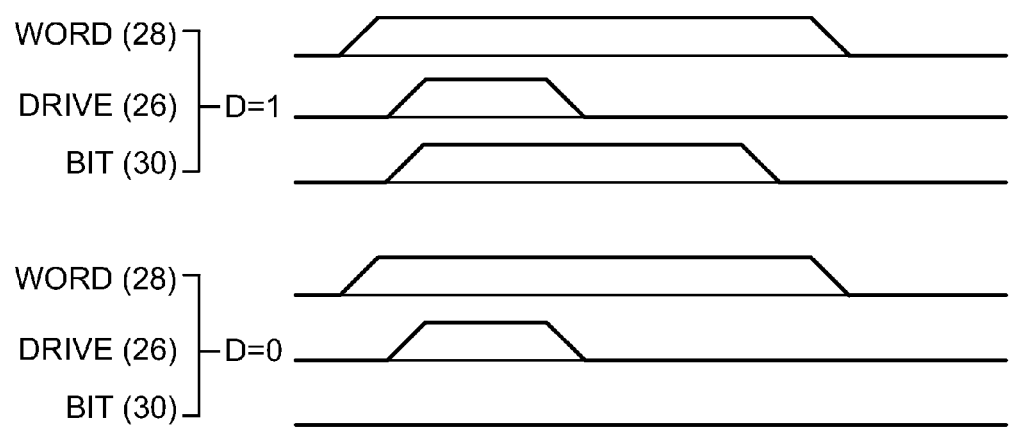
FIG. 5 is a set of waveforms illustrating the writing of data 1 and data 0 states into the memory system shown in FIG. 4.
Figure 6:
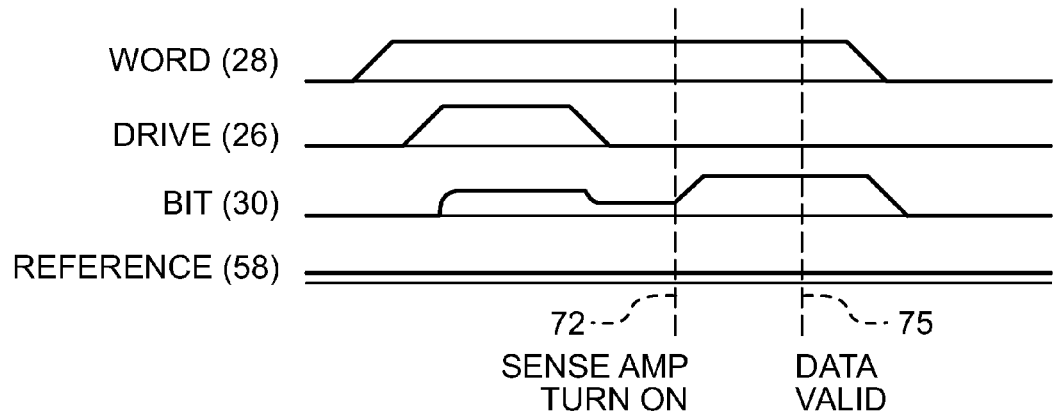
FIG. 6 is a set of waveforms illustrating the reading of a data 1 from the memory system shown in FIG. 4.
Figure 7:
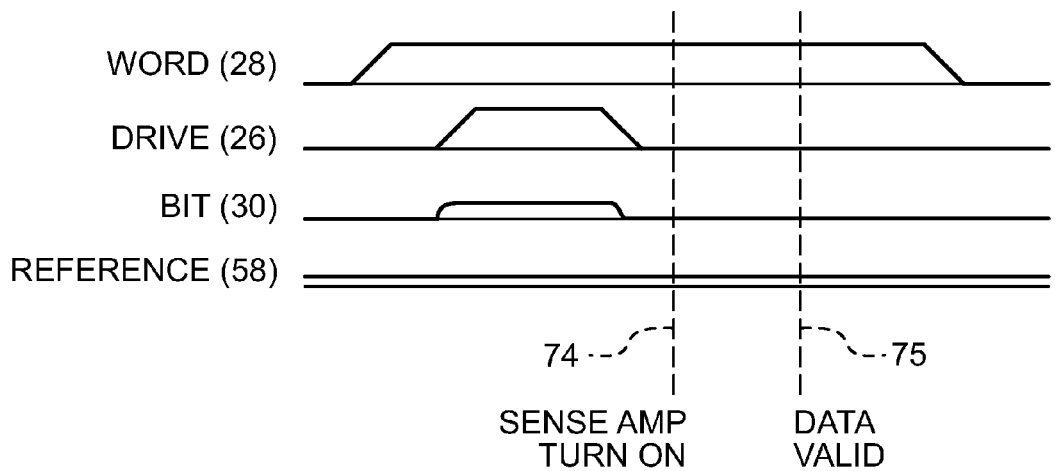
FIG. 7 is a set of waveforms illustrating the reading of a data 0 state from the memory system shown in FIG. 4.

Operation of the memory system 36 is now described in reference to FIG. 4 and to the waveforms shown in FIGS. 5, 6 and 7. The writing of a data 1 and a data 0 is shown in reference to FIG. 5. There will first be described the writing of a data 1 state into the memory circuit 20. A data state 1 is applied to the input/output terminal 62, while an address that selects the memory circuit 20 is input through the terminal 38. The memory system 36 is activated by a low input at the chip enable terminal 40. A write signal is input to the terminal 42. The circuit 48 decodes the address and applies a word line signal to the line 28 to activate the transistor 24. This occurs at the rising edge of the word line signal. The circuit 46 generates a drive line pulse on the drive line 26. The sense amplifier 56 responds to the data 1 input by generating a high level pulse signal on the bit line 30. When the transistor 24 is conductive, the ferroelectric capacitor 22 receives a net zero voltage when the drive line pulse is high. But when the drive line pulse goes to zero, the ferroelectric capacitor 22 receives a negative electric field (bit line 30 high and drive line 26 low) and is therefore oriented to have a negative polarization, which is indicated as P(1) in FIG. 1. When the word line 28 drops to the low level, the transistor 24 is turned off and the ferroelectric capacitor 22 is isolated. The capacitor 22 retains the P(1) polarization state.

The writing of a data 0 state is much like that for the data 1 state described above. The only difference is that the sense amplifier 56 holds the bit line at a low data state. The word line is activated in the same manner. With a low state on the bit line 30 and a high state on the drive line 26, the ferroelectric capacitor has its polarization set to the P(0) state, as indicated in FIG. 1. When the drive line pulse goes low, there is no voltage across the capacitor 22. Further, as noted above, the negative polarization state indicates a data 1, while a positive polarization state is used to indicate a data 0. This is an arbitrary definition that is used for convenience in reading the outputs from the memory circuit 20.

The reading of a data state which has previously been stored in the memory circuit 20 is now described in reference to FIG. 6. In reading a memory circuit there must be applied an address to the terminal 38 and this address is decoded by the circuit 48 to produce the word line signal at line 28. The chip enable signal is provided through line 40 to activate the memory system 36. The read state of the read/write signal is input through the terminal 42. For this case, the data state to be read from the memory circuit 20 will be output to the input/output terminal 62. Upon receipt of the chip enable command, a predetermined voltage pulse is generated by the circuit 46 and applied as the drive pulse to the drive line 26. This is a positive going pulse. For reading a data 1 state, which has the negative polarization, the drive line causes a charge transfer through the transistor 24 to the bit line 30. This serves to charge the bit line 30 and increase the voltage thereon as indicated by the waveform for bit line 30 in FIG. 6. Even after the drive line 26 returns to 0, there remains a net charge on the bit line 30. This is a result of transitioning counterclockwise from the P(1) state to the P(0) state as shown in the hysteresis curve in FIG. 1. At the time indicated by a line 72, the sense amp 56 is activated. The sense amp 56 has two inputs which are compared. The first input is the bit line 30 and the second input is a reference voltage which is received through line 58. If the bit line voltage exceeds the reference voltage, then the sense amplifier 56 drives the bit line to a full positive voltage state. This is shown in FIG. 6 immediately following the line 72. Thus the P(1), negative polarization orientation produces a data 1, positive voltage state. The data state on the bit line 30 is then passed through the line 64 to the output circuit 60 for supply to the terminal 62. Thus, the complete cycle of applying an address to the memory system 36 is completed by receiving an output data state at the terminal 62.

The output data reaches a valid state as indicated by line 75.

A further important aspect of the present invention is the restore aspect. As can be seen in FIG. 6, the sense amplifier drives the bit line 30 back to the full positive power state. Since the transistor 24 is turned on because word line 28 is high, and the drive line 26 has returned to the low voltage state, the negative polarization state P(1) is reapplied to the ferroelectric capacitor 22. The sense amplifier then pulls the bit line to 0 thereby reducing the electric field across the capacitor 22 to zero. The word line 22 then returns to 0, thereby deactivating the transistor 24 and isolating the capacitor 22. As a result of this operation and timing, the ferroelectric capacitor 22 is destructively read, but immediately restored to the original state. This process of immediate restoration provides a considerable time saving over previous destructive reading techniques which take the output data and perform a complete write cycle to restore the original state in the memory cell. The process of the present invention in providing immediate restoration of the data state to the ferroelectric capacitor significantly increases the speed of the memory system 36 and its data availability, as compared to previous non-volatile memory circuits.

The operation of reading a data 0 for the memory system 36 shown in FIG. 4 is illustrated by the waveforms shown in FIG. 7. The addressing, enabling and read\write inputs to the system 36 are the same as described above in reference to FIG. 6. When the word line 28 goes to the high state, the transistor 24 is activated, thereby connecting the ferroelectric capacitor 22 serially between the drive line 26 and bit line 30. The circuit 46 likewise produces a fixed positive drive pulse on the drive line 26. In this instance the ferroelectric capacitor has previously been set to the P(0) polarization state. The application of a positive field to the ferroelectric capacitor 22 results in only moving the polarization state from P(0) up to $P_s$ and then back to P(0) as shown in the hysteresis curve in FIG. 1. As a result, there is little or no net current transfer through the transistor 24 to the bit line 30, which returns to a low voltage state following the drive pulse. The sense amplifier 56 is activated at a time indicated by a line 74 to make a comparison between the voltage on the bit line 30 and the reference voltage received through line 58. In this case the voltage on the bit line 30 is less than the reference voltage, therefore, the sense amplifier drives the bit line 30 to the low voltage state following the drive pulse. This voltage state is then passed through the line 64 to the circuit 60 and applied to the input/output terminal 62. Note that in the case for reading a data 0, there is no change in the polarization state on the ferroelectric capacitor 22. Thus, the reading of a data 0 state does not destroy the data state in the capacitor 22. Therefore, there is no need for any type of restore operation or subsequent write cycle.

For the operations of reading both a data 1 state and a data 0 state, the present invention eliminates any need for a separate data restoration step, which is the conventional process used in memory systems having destructive reads. The process of providing automatic restoration is a substantial advantage for the circuit of the present invention.

Figure 8:
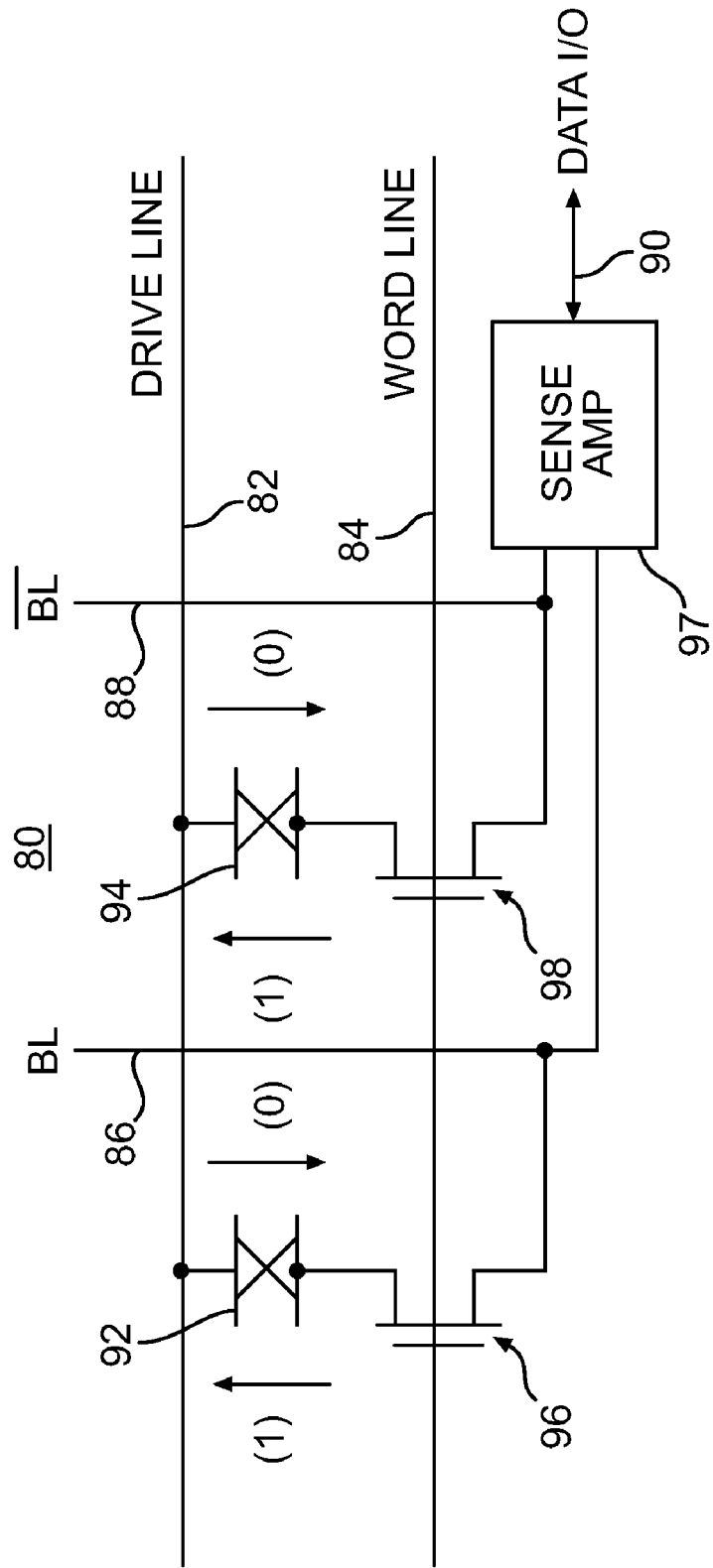
FIG. 8 is a non-volatile memory circuit having a double memory cell in accordance with the present invention.

A further aspect of the present invention is a double element memory circuit 80 shown in FIG. 8. The circuit 80 uses two ferroelectric capacitors for the storage of a single data state. This effectively doubles the signal-to-noise ratio for the memory circuit which in turn increases its reliability and decreases its susceptibility to noise and other interference. It has further been found that certain ferroelectric capacitor substances have a hysteresis characteristic, at least during the early lifetime. When compared to a fixed reference, as with the circuit 20 shown in FIG. 2, the hysteresis characteristic can change sufficiently to reduce the signal-to-noise ratio to an unacceptable level. The circuit 80 provides identical ferroelectric capacitors which have the same hysteresis characteristics. The two capacitors are also subjected to the same number of pulse cycles. By reading these two capacitors differentially, the time changing of characteristics can be minimized, while the increased voltage differential enhances the reliability of the memory circuit. The circuit 80 has a drive line 82, a word line 84, a bit line 86 and bit bar line 88. The lines 86 and 88 have complementary voltage states. There is further included a data input/output line 90.

The memory circuit 80 includes ferroelectric capacitors 92 and 94 and access transistors 96 and 98. A first terminal for each of the capacitors 92 and 94 is connected to the drive line 82. The drain terminals for each of the MOS transistors 96 and 98 are connected respectively to the remaining terminals of the ferroelectric capacitors 92 and 94. The word line 84 is connected to the gate terminals of the transistors 96 and 98. The source terminals of transistors 96 and 98 are connected respectively to the bit line 86 and the bit bar line 88. The memory circuit 80 further includes a sense amplifier 97 which has the bit lines 86 and 88 as inputs. The sense amplifier 97 is further connected to the data input/output line 90.

The data 1 and 0 states correspond to the polarization states described above for circuit 20 in FIG. 2. In the memory circuit 80, the capacitors 92 and 94 are always set to have opposite polarization states. The operation of the memory circuit 80 is very similar to that shown for circuit 20 in FIG. 2. The major difference is that the reference voltage is removed and replaced with a second ferroelectric capacitor memory cell. The sense amplifier functions in the same manner to detect the differences between the two bit lines just as detecting the difference between one bit line and the reference voltage. The writing and restoration operations function in the same manner as described above.

Figure 9:
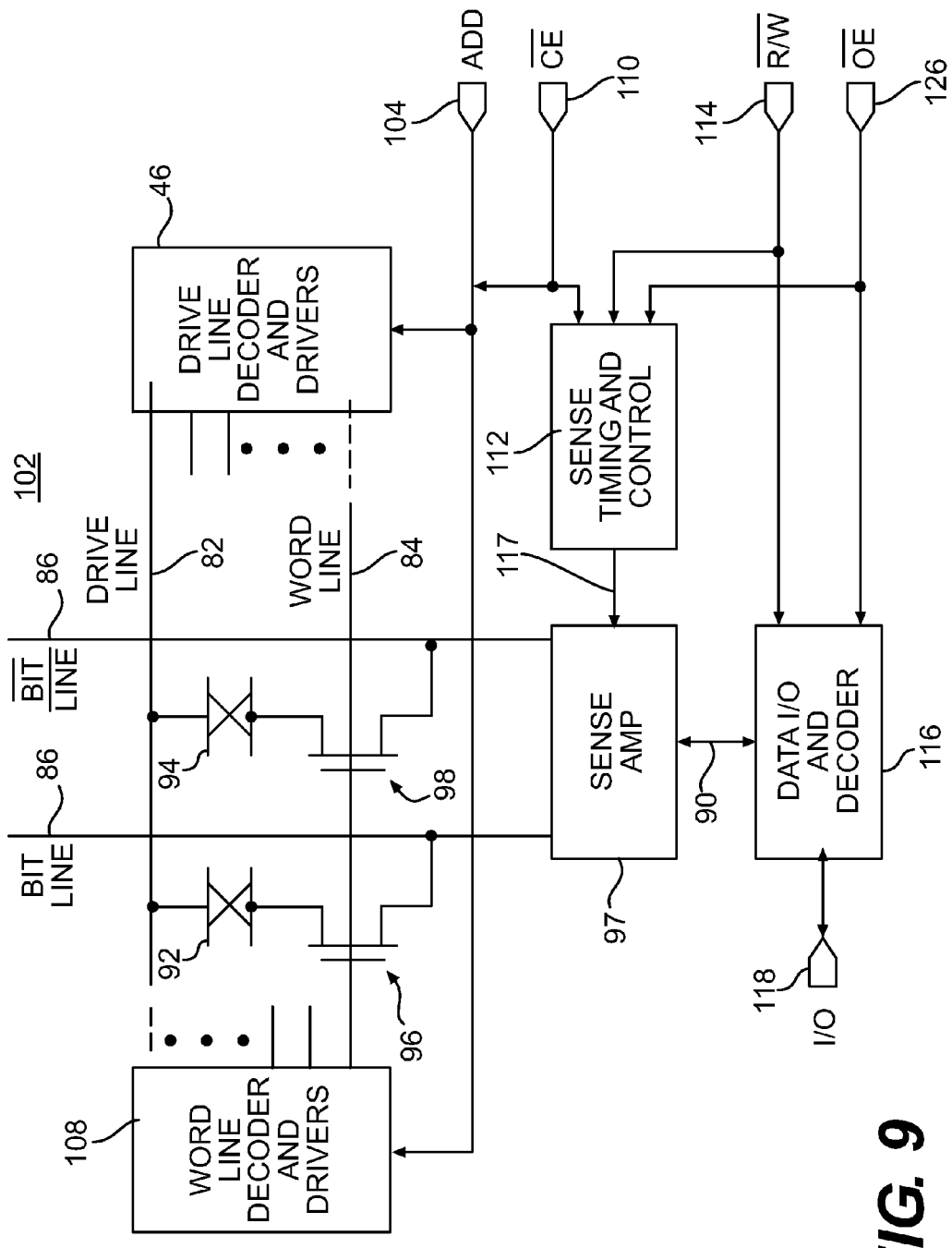
FIG. 9 is a memory system utilizing the double memory cell circuit shown in FIG. 8.

A memory system 102 for implementing the dual memory circuit 80 is illustrated in FIG. 9. The common circuit elements from FIG. 8 are reproduced in FIG. 9 with similar reference numerals. The memory system 102 receives addresses through an address terminal 104 and these addresses are provided to a drive line decoder and driver circuit 106 and a word line decoder and driver circuit 108. The address input may comprise parallel lines. The circuit 106 produces the drive line signals for line 82, while the decoder and driver circuit 108 produce the word line signals for line 84.

A chip enable signal, CE bar, is input through a terminal 110 where it is provided to a sense timing and control circuit 112, as well as to the circuits 106 and 108.

A read/write signal is input at a terminal 114 where it is provided to the sense timing and control circuit 112, as well as to a data input/output and decode circuit 116.

The circuit 112 provides timing and control signals through a line 117 to the sense amplifier 97. The decode circuit 116 provides data to and from the sense amplifier 97 through the line 90. An input/output terminal 118 provides data to and from the data input/output and decode circuit 116.

The memory system 102 further includes an output enable terminal 126 which is connected to the sense timing and control circuit 112, as well as to the data input/output and decode circuit 116.

Figure 10:
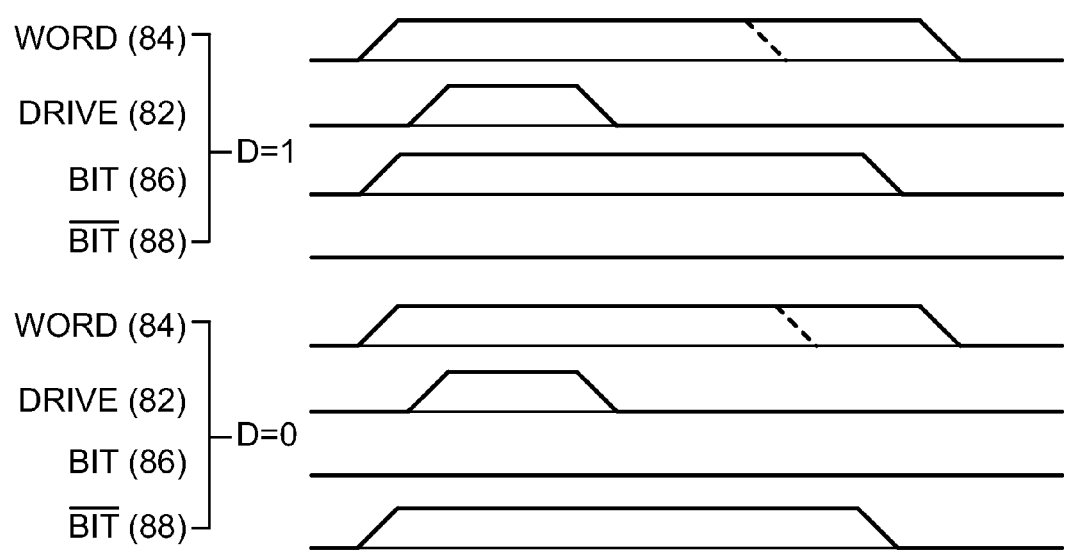
FIG. 10 is a set of waveforms illustrating the writing of data 1 and data 0 states into the memory system shown in FIG. 9.
Figure 11:
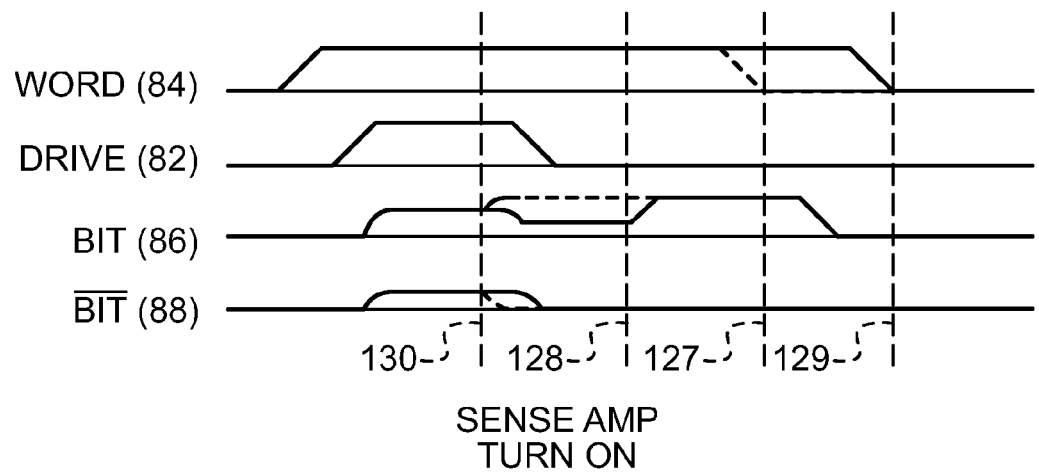
FIG. 11 is a set of waveforms illustrating the reading of a data 1 state from the memory system shown in FIG. 9.
Figure 12:
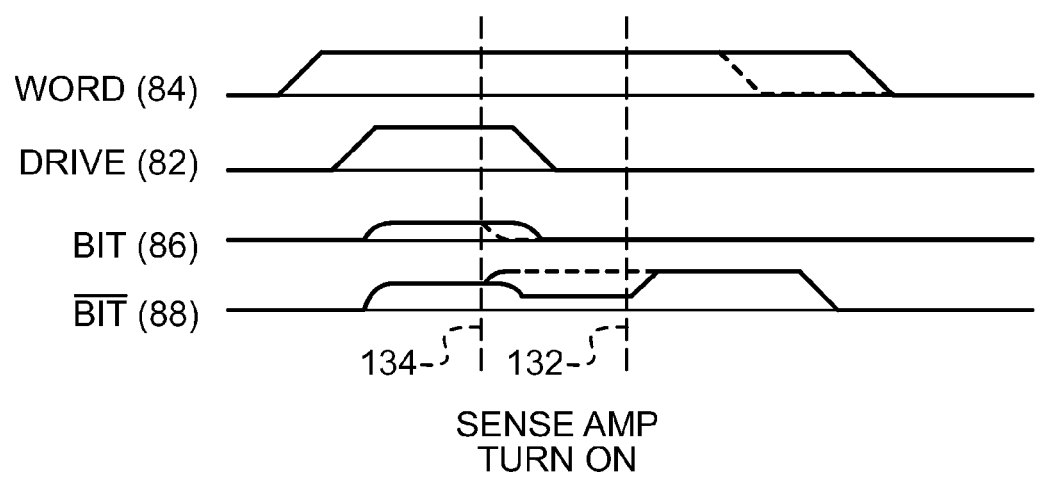
FIG. 12 is a set of waveforms illustrating the reading of a data 0 state from the memory system shown in FIG. 9.

Operation of the memory system 102 shown in FIG. 9 is now described in reference to FIGS. 10, 11 and 12. Writing of data into the capacitors 92 and 94 is described in reference to the memory system 102 shown in FIG. 9 and the waveforms in FIG. 10. The first description is for the writing of a data 1 state. An address is received through the terminal 104 and this address is decoded by the circuit 108 to activate the word line 84. The data 1 state is input through the terminal 118 to the circuit 116 which further provides this data state to the sense amplifier 97. The drive line 82 is driven to a positive state by the circuit 106. The sense amplifier 97 applies a high signal to the bit line 86 and a low level signal to the bit line 88. Since the high state on the word line 84 has activated the transistors 96 and 98, the ferroelectric capacitor 92 initially has a high state on both terminals, but after the drive line pulse goes to a low state, the bit line 86 will be high and the drive line will be low, thereby applying a negative field to produce the negative polarization state P(1) on capacitor 92. The ferroelectric capacitor 94 has a high state on the drive line 82 and a continuous low state on the bit bar line 88. This applies a positive field polarity which establishes the polarization state P(0) on the capacitor 94. Thus, the capacitors 92 and 94 are set to have opposite polarization states. This combination is arbitrarily defined to be a data 1 state.

The writing of a data 0 is much like that of writing a data 1 with the only difference being a reversal of the voltage states on the bit line 86 and bit bar line 88. As a result of this reversal, the ferroelectric capacitor 92 is set to a P(0) polarization state, while the ferroelectric capacitor 94 is set to a P(1) polarization state. This combination is arbitrarily defined to be a data 0 state. In each of the above write examples, the word line is turned off after the polarization orientation is set to thereby isolate the ferroelectric capacitors 92 and 94.

Note in FIG. 10 that the word line 84 signal can be turned off, go low, either before or after the signal at the bit lines 86 or 88 goes low.

The reading of a data 1 state for the memory system 102 is illustrated by the waveforms in FIG. 11. In detecting a data state, a sense amplifier must be turned on. The time at which a sense amplifier 97 is activated is optionally done at the times indicated by lines 128 and 130. For the first example, the sense amplifier is activated at the time indicated by the vertical line 128. In reading the memory system 102, there must again be applied an address through the terminal 104, which address is decoded by the circuit 108 to activate the word line 84. This serves to turn on the transistors 96 and 98. This occurs when the signal on line 84 goes to the initial high state. The read command is input through the terminal 114 to the circuit 116 which in turn transmits a command for activating the circuit 106 to apply a pulse to the drive line 82. This is shown in FIG. 11. For the capacitor 92, the polarization state is switched from P(1) to P(0) which transfers charge to the bit line 86. The bit bar line 88 receives little or no net charge and therefore the voltage on line 88 is approximately zero after the drive line has returned to a low level. The sense amplifier 97 is turned on at the time indicated by line 128. This sense amplifier compares the voltage states on the lines 86 and 88. Whichever line has the greater voltage will be driven to the full positive voltage level. This is shown for the line 86 in FIG. 11 immediately following line 128. The remaining line, line 88, is held at the low level voltage state. After the sense amplifier 97 is activated, the data 1 state condition exists for the bit lines 86 and 88, the word line drops to the low level to deactivate the transistors 96 and 98, thereby isolating the ferroelectric capacitors 92 and 94.

It is important to note at this point that the ferroelectric capacitors have been left in the same polarization state that they were in before the read operation occurred. The circuit of the present invention provides automatic self-restoration in the same manner as described above for the single element memory circuit. There is thus no requirement to have a second write cycle to restore the data state which was read from the cell, which is the usual practice when making a destructive read from a memory.

In an optional read method, the sense amplifier is activated at the time indicated by line 130. The waveform responses for this activation time are shown by the dashed lines. This sense amplifier activation occurs during the time that the drive line 82 pulse is still high. Reading at the earlier time in the cycle provides a faster read cycle, but is more sensitive to differences in the two capacitors 92 and 94. There is also a different capacitor wear-out mechanism which affects long term reliability.

In the read operation shown in FIG. 11, the word line can be turned off during either of times identified by lines 127 or 129. At the time shown by line 127 the sense amplifier 97 is still on and the bit lines 86 and 88 are differentially charged. If the word line goes off at the time for line 127, a voltage will be left across one of the capacitors 92 or 94. Although this charge will leak off, it could possibly be detrimental to the ferroelectric material. If this is the case, the word line should be turned off at approximately the time shown by line 129, which is after the sense amplifier 97 has been turned off and voltage has been removed from both of the capacitors 92 and 94.

The operation for reading a data 0 from the memory system 102 is illustrated by the waveforms in FIG. 12. Like the read operation described above, the address is provided through terminal 104, a chip enable signal through terminal 110 and a read command through terminal 114.

In FIG. 12, there are shown two times for activating the sense amplifier, these times are indicated by the lines 132 and 134. In this read operation, the drive line 82 receives a similar positive drive pulse which is applied to the capacitors 92 and 94. But since the polarization states of these capacitors are opposite, the bit bar line 88 retains a charge, while the bit line 86 returns to a low voltage state when the drive voltage pulse on line 82 drops. When the sense amplifier 97 is activated, at the time indicated by line 132, the bit bar line 88 is pulled to a high voltage state, while the bit line 86 is held at the low voltage state. Again, it must be noted that this action of the sense amplifier 97, in conjunction with the drive line returning to a zero state, serves to restore the initial polarization states to the ferroelectric capacitors 92 and 94, thereby eliminating the need for any subsequent restore cycle.

Figure 13:
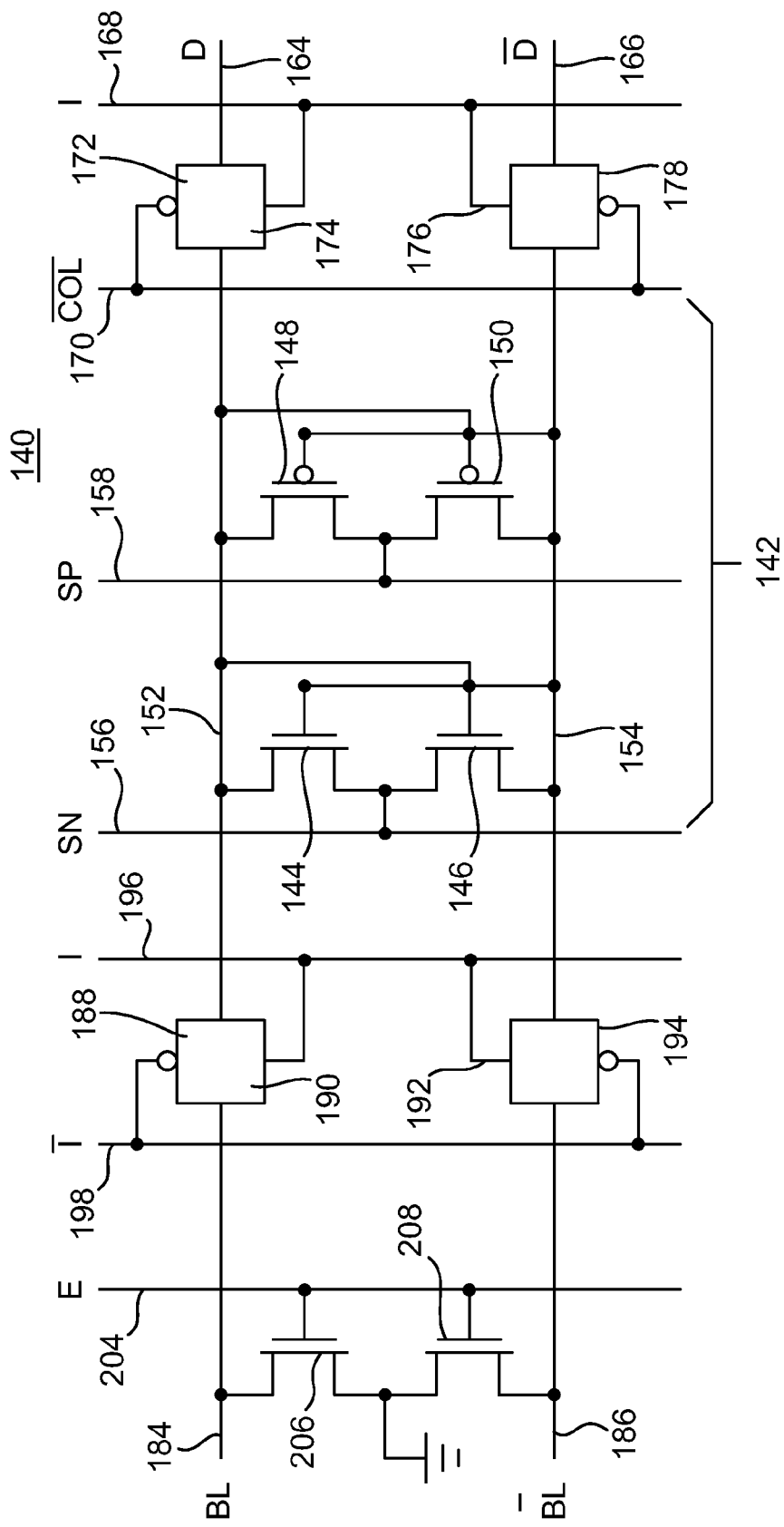
FIG. 13 is an illustration of the sense amplifier shown in FIGS. 4 and 9 together with bit-line equalization circuitry, isolation circuitry and column address circuitry.

As an option, the sense amplifier can be turned on at the time indicated by the line 134. This produces a faster, more sensitive read cycle. In each of the above circuits there is included a sense amplifier for detecting data states by comparison of a bit line state to a reference value or the comparison of the states of two bit lines. Referring to FIG. 13, a circuit 140 includes a sense amplifier 142 for carrying out these functions. Additional circuitry is included within the circuit 140 for accomplishing additional aspects of the memory operations. The sense amplifier 140 includes transistors 144, 146, 148 and 150. These are connected between a sense amp line 152 and a sense amp bar line 154. These sense amp lines connect to the bit lines shown in FIG. 9 and the bit line and reference line shown in FIG. 4. The sense amplifier 142 is controlled through an SN (Sense Negative) line 156 and an SP (Sense Positive) line 158.

Transistors 144 and 146 are enhancement mode NMOS devices while transistors 148 and 150 are enhancement mode PMOS devices. The drain terminals of transistors 144 and 148 are connected to the sense amp line 152 while the source terminals of transistors 146 and 150 are connected to the sense amp bar line 154. The gate terminals of transistors 144 and 148 are connected to the bit bar line 154, while the gate terminals of transistors 146 and 150 are connected to the sense amp line 152. The source terminal of transistor 144 is connected to the drain terminal of transistor 146, as well as to the SN line 156. The source terminal of transistor 148 is connected to the drain terminal of transistor 150 and to the SP line 158.

Circuit 140 further includes a data line 164 and a data bar line 166. A column line 168 and a column bar line 170 are connected to transistors 172, 174, 176 and 178 to connect or isolate the data lines 164 and 166 with the corresponding sense amp lines 152 and 154. The transistors 174 and 176 are enhancement NMOS devices. The transistors 172 and 178 are enhancement PMOS devices. Transistors 172 and 174 each have the source and drain terminals thereof connected between line 164 and line 152. Transistors 176 and 178 likewise have the source and drain terminals thereof connected between the data bar line 166 and the bit bar line 154. Column line 168 is connected to the gate terminals of transistors 174 and 176, while the column bar line 170 is connected to the gate terminals of transistors 172 and 178.

The column and column bar lines 168 and 170 have complementary states. When the column line 168 is high and the column bar line 170 is low, the sense amp lines 152 and 154 are connected to the data lines 164 and 166. But, when the column line 168 is low and the column bar line 170 is high, the data lines 164 and 166 are isolated from the sense amp lines 152 and 154.

The sense amplifier 142 can be isolated from an internal bit line 184 and a bit bar line 186 by the action of isolation transistors 188, 190, 192 and 194. The transistors 190 and 192 are enhancement mode NMOS devices, while the transistors 188 and 194 are enhancement mode PMOS devices. The circuit 140 further includes an I (Isolation) line 196 and an I bar line 198 which, when activated, provide isolation between the bit lines 184, 186 and the sense amp lines 152, 154 connected to the sense amplifier 142. The I line 196 is connected to the gate terminals of transistors 190 and 192 and the I bar line 198 is connected to the gate terminals of transistors 188 and 194. The source and drain terminals of transistors 188 and 190 are connected between the lines 152 and 184, while the source and drain terminals of transistors 192 and 194 are connected between lines 154 and 186. The lines I and I bar have complementary states. When the I line is high and the I bar line is low, the lines 152 and 184 are connected together and the lines 154 and 186 are connected together. When opposite voltage states are present on the lines 196 and 198, the sense amp lines 152, 154 and the bit lines 184, 186 are isolated.

When the circuit 140 is employed as the sense amplifier 97 in FIG. 4, bit lines 184 and 186 are connected respectively to bit lines 86 and 88. Likewise, for FIG. 9, the bit lines 184, 186 are connected respectively to the bit lines 86, 88.

The circuit 140 further includes an E (Equalization) line 204. This line is connected to the gate terminals of enhancement mode MOS transistors 206 and 208. Transistor 206 has the drain terminal thereof connected to bit line 184, and transistor 208 has the source terminal thereof connected to bit line 186. The source terminal of transistor 206 and the drain terminal of transistor 208 are connected together and to a circuit ground. When the E line 204 is activated, the transistors 206 and 208 are turned on, thereby connecting the bit lines 184 and 186 together and to ground. This is done prior to any reading of the sense amp lines of the memory circuit to equalize the voltage levels on the bit lines before any charge is transferred from the ferroelectric capacitors.

Figure 14:
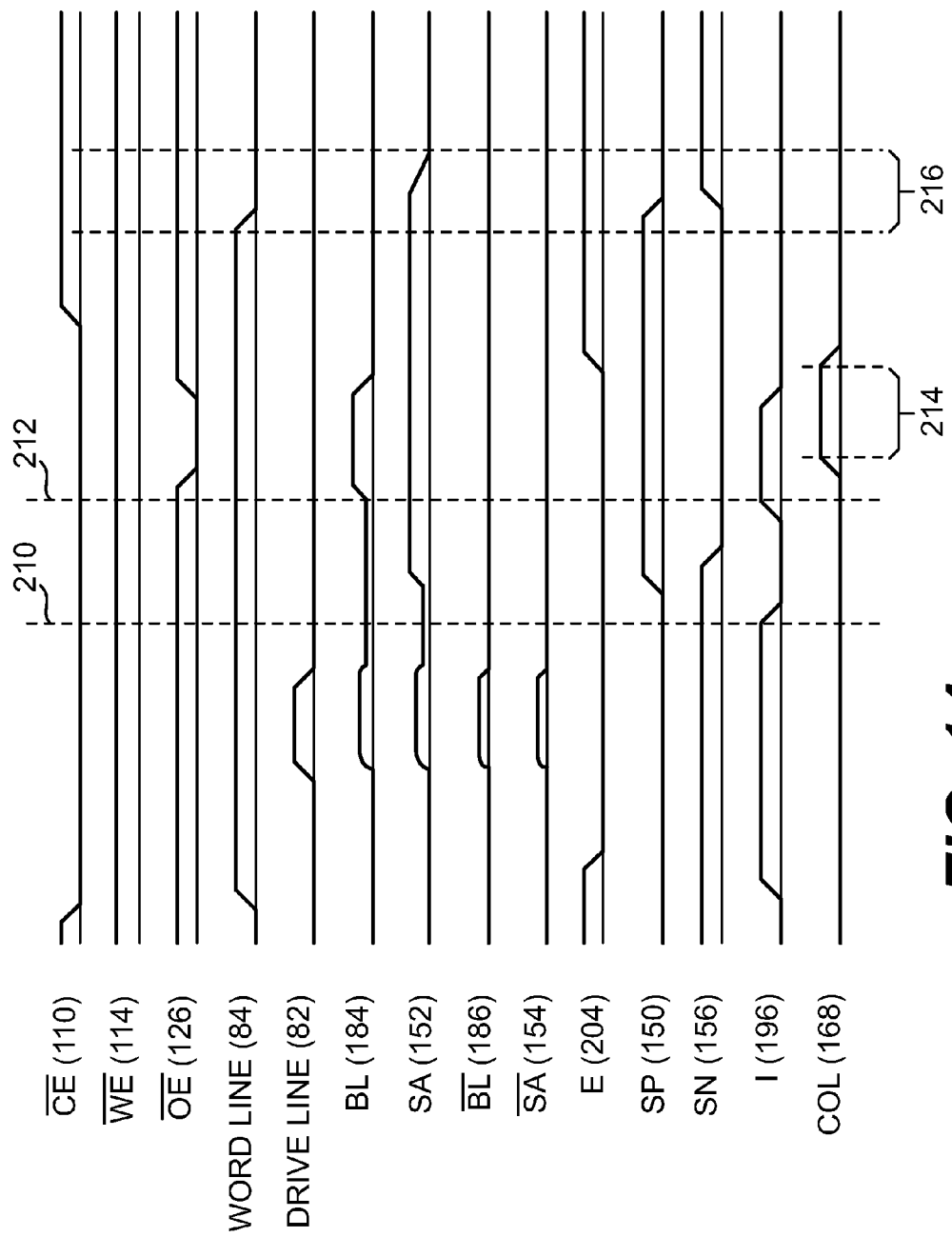
FIG. 14 is a set of waveforms illustrating the operation of the sense amplifier shown in FIG. 13 for reading a data 1 state.
Figure 15:
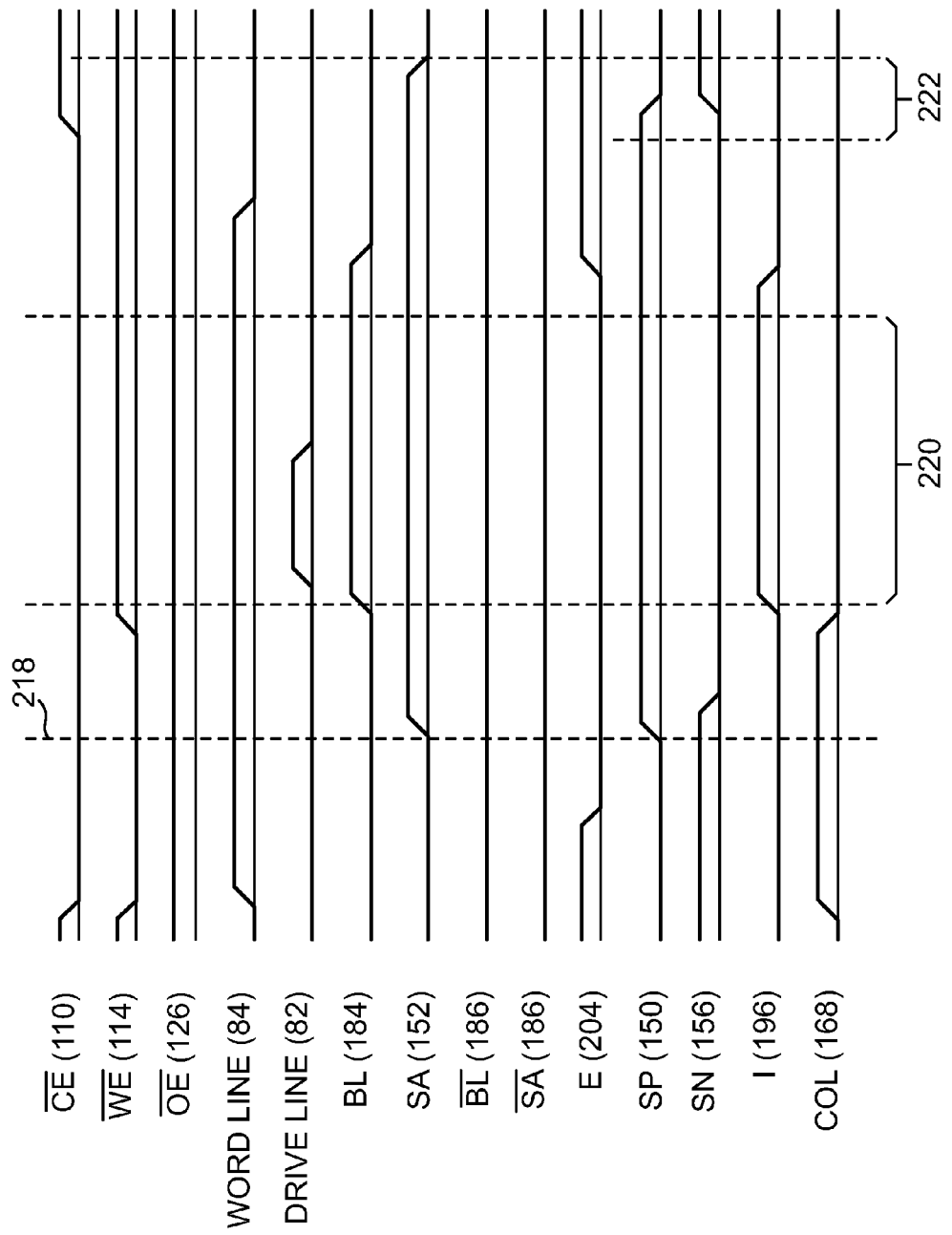
FIG. 15 is a set of waveforms illustrating the operation of the sense amplifier shown in FIG. 13 for writing a data 1 state into a memory cell.

Operation of the sense amplifier 142 in the circuit 140 is now described in reference the circuits shown in FIGS. 9 and 13 and to the waveforms shown in FIGS. 14 and 15. A read operation to read a data 1 is illustrated in FIG. 14. In the initial condition, the chip enable signal goes low to allow access to the memory system 102. Word line 84 is turned on to activate transistors 96 and 98. The isolation signal I goes high to connect the sense amp lines 152 and 154 from the bit lines 184, 186. The equalization signal, previously on, at line 204, goes low to separate the balanced bit lines 184 and 186.

Next, the drive pulse at line 82 goes high, thereby causing charge transfer from capacitors 92, 94 to lines 152, 154, 184, and 186. Capacitor 92 undergoes a polarization state change and transfers a greater charge to lines 152, 184. Lines 154, 186 receive a lesser charge. When the drive pulse returns to zero, net charge remains on lines 152 and 184.

At the time shown by a line 210, the isolation signal at line 198 is deactivated to isolate bit lines 184, 186 from the sense amp lines 152, 154. The sense amplifier 142 is then activated by the SP and SN signals on lines 150 and 156. As a result, the sense amp line 152 is pulled to a full positive voltage state and sense amp line 154 is held at zero.

Just before the time indicated by vertical line 212, the output enable bar signal at line 126 goes to the active state.

At the time shown by line 212, the isolation I signal at line 196 goes high to connect the sense amp lines 152, 154 to the bit lines 184, 186. This pulls bit line 184 high.

Next, the column signal at line 168 is activated during the time period 214. This applies the data states on the lines 152, 154 to the data lines 164, 166. The output enable signal at line 126 goes to the disable state during period 214. Also the isolation signal at line 196 goes low which allows the bit line 184 to go low due to activation of the equalization signal at line 204.

Next, the chip enable signal at line 110 goes to the high, disabled, state.

At the start of a time period 216, the word line signal at line 84 goes low to turn off transistors 96 and 98 and thereby isolate the capacitors 92 and 94, which have both been maintained at their original polarization states.

Next the SP and SN signals at lines 150 and 156 return to the initial states to deactivate the sense amplifier 142. This causes the sense amp line 152 to go to the ground state together with line 154. This completes the read cycle.

The use of the sense amplifier 142 and the writing of data states is indicated by the waveforms shown in FIG. 15. For this example, a data 1 state is written into the memory system, such as the system 102. The equalization line 204 connects the bit lines 184 and 186 to equalize the charge at a ground level. In the next step, the column line 168 transitions to the high voltage state to activate the column transistors 172, 174, 176 and 178 which connect the data lines 164 and 166 to the sense amp lines 152 and 154. During this part of the cycle, the I line 196 is activated to connect the bit line 184 to the sense amp line 152 and the bit line 186 to the sense line 154. The sense amplifier 142 is activated when the transitions occur for the SP line 158 and the SN line 156. The data signal on lines 164 and 166 serve to set the state of the sense amplifier 142. Sense amplifier 142 is turned on at the time indicated by a line 218. Thus, the appropriate data states are established on the sense amp lines 184 and 186. At the beginning of an interval 220, the drive line 82 transitions from the low state to the high voltage state. Referring back to FIG. 9, this action serves to set the state in the ferroelectric capacitor 94. When the drive line pulse drops from the high to the low state, a polarity differential is developed across the ferroelectric capacitor 92, which is opposite from that applied to the capacitor 94. Therefore, complementary polarization states are set in the ferroelectric capacitors 92 and 94. This occurs during a time period 220. The sense amplifier 142 is turned off during a time period 222 after the data states have been set in the ferroelectric capacitors 92 and 94. The word line 114 signal is deactivated prior to the turning off of the sense amplifier 142 to isolate the ferroelectric capacitors.

Finally, the equalization signal at E line 204 returns to a high state to balance and discharge the bit lines 184 and 186.

Figure 16:
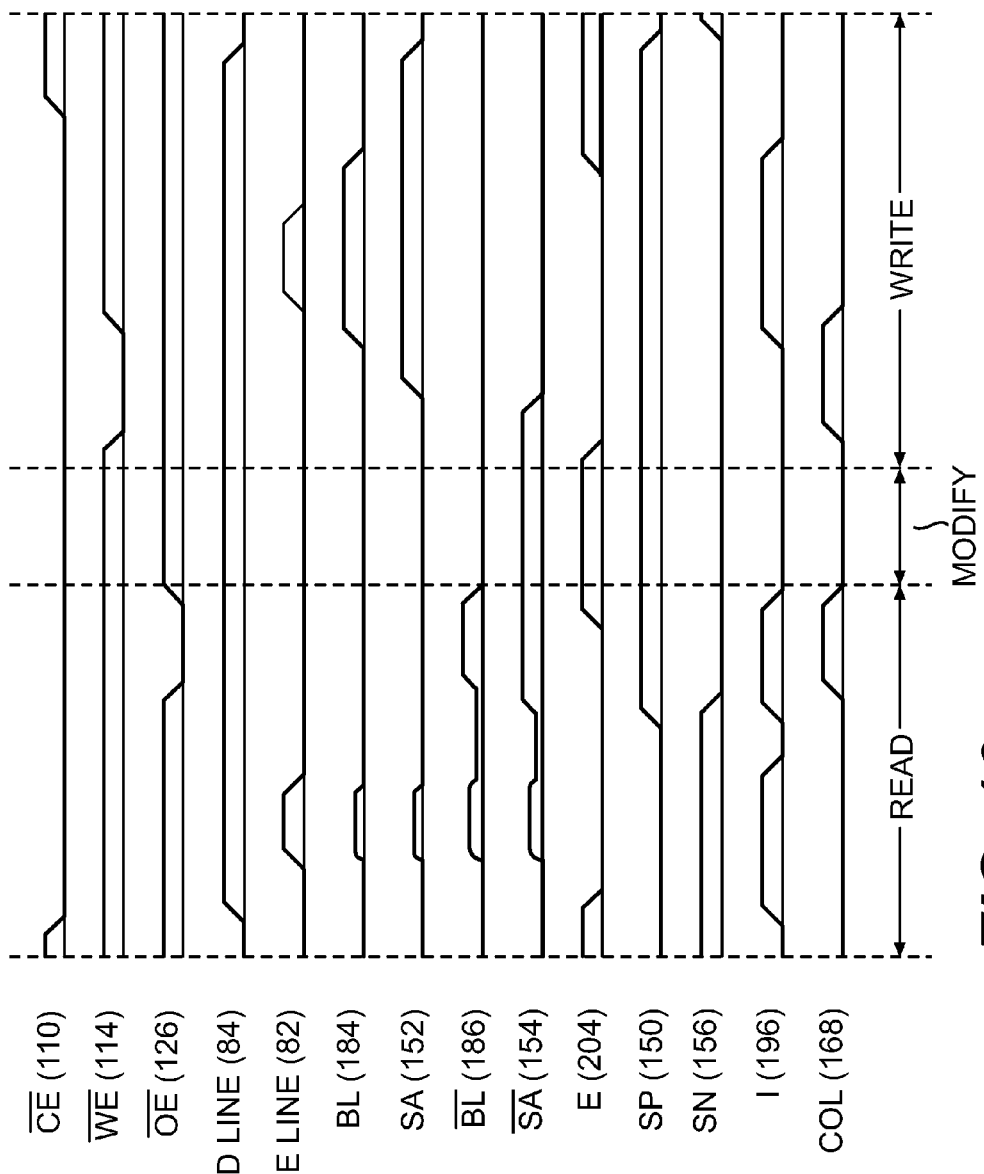
FIG. 16 is a set of waveforms illustrating the operation of the memory system shown in FIG. 9 and the sense amplifier shown in FIG. 13 to perform a read/modify/write cycle.

Referring now to FIG. 16, there is shown a group of waveforms illustrating a memory operation process which is termed read/modify/write. This is a process for providing a very fast read from a memory, modification of the results by operation of software, followed by writing the modified results back into the memory. All of this is accomplished in a single cycle which is shorter than the sum of both a read cycle and a write cycle.

Further referring to FIG. 16, there are three sequential time periods which are labeled as READ, MODIFY and WRITE. The read portion is basically the same as that shown in FIG. 14 for reading a logic state, while the write portion is basically the same as that shown in FIG. 15 for writing a logic state.

The equalization signal at line 204 is maintained high before the cycle starts to equalize the bit lines 184 and 186.

The read/modify/write cycle is initiated by the chip enable signal at line 110 going to a low, active state. Following this transition, the signal at word line 84 goes to a high state to activate the transistors 96 and 98. The isolation signal at line 196 is next activated to connect the bit lines 184, 186 with sense amp lines 152, 154.

Next, the drive line 82 is supplied with a positive pulse which applies a bias to the ferroelectric capacitors 92 and 94. The amount of charge transferred to the bit lines 184 and 186 is dependent upon the previous polarization orientations of the capacitors 92 and 94, as described above. Following the drive line pulse, the isolation signal at line 196 returns to a low state to isolate the bit lines 184 and 186 from the sense amp lines 152 and 154. At this time, the sense amplifier 142 is activated by state transitions of the SP and SN lines 156 and 158. Activation of sense amplifier 142 causes the sense amp lines 152 and 154 to be driven to either a high or a low voltage state depending upon the charge received from the ferroelectric capacitors 92 and 94. In the present example, the sense amp line 152 is driven to a low state, while the sense amp line 154 goes to a high state. This is the reading of a logic 0 from the memory system 102.

Following activation of the sense amplifier 142, the isolation signal at line 196 is again activated to connect the bit lines 184 and 186 to the sense lines 152 and 154. As a result, the bit lines 184 and 186 are driven to or held at the states of the corresponding lines 152 and 154. After activation of the isolation signal at line 196, and still during the read portion of the waveform, the column signal at line 168 is activated to connect the sense lines 152 and 154 with the data lines 164 and 166. This serves to transfer the data state read from the memory system 102 to the output data lines 164 and 166.

At this point, there is a transition in the waveforms to the modify portion of the cycle. During this time, the memory has its address circuitry activated by a microprocessor with no address change. The memory is awaiting the start of the write cycle of the read, modify, write sequence. No new address is provided to the memory system 102.

Immediately following the modify portion of the cycle, the write enable signal at line 114 transfers from the read state to the write state. Thereafter, the equalization signal, which was previously in the on state, is deactivated to decouple the bit lines 184 and 186. Next, the column line goes to the active state to couple the bit lines 152 and 154 to the data lines 164 and 166. This serves to transfer the data state to be written into the memory system 102 from the output data lines to the terminals of the sense amplifier 142. For the present example, this is the inverse of the state read from memory, that is, a logic 1 state.

Next, the data lines 164 and 166 go through a state transition.

The write enable signal next transitions from the write enable state to the write disable state. Shortly thereafter, the isolation signal at line 196 goes to the high state to couple the bit lines 184 and 186 to the sense amplifier lines 152 and 154. The column signal at line 168 then transfers to the low state to decouple the data lines 164 and 166 from the sense amplifier bit lines 152 and 154, but this step is optional.

Next, the drive line is pulsed to provide the appropriate differential across the ferroelectric capacitors 92 and 94. The logic state on the bit line 184 is maintained for a sufficient time period to apply the appropriate voltage field differential across the ferroelectric capacitors 92 and 94. This is similar to the write operation described above.

The equalization signal at line 204 is next activated to couple bit lines 184 and 186, after the isolation signal at line 196 is deactivated to decouple bit lines 184 and 186 from the sense amplifier lines 152 and 154. In the final steps, the chip enable signal returns to the disable state, the word line returns to a low state, thereby deactivating the access transistors 96 and 98 and the sense amplifier control signals at lines 156 and 158 return to the inactive state.

The above description in reference to FIG. 16 can provide a read/modify/write cycle in a shorter time than separate cycles because the address provided to the memory system 102 does not have to be changed, but is maintained throughout the entire cycle.

In summary, the present invention comprises a circuit for writing to and reading from non-volatile memory cells using ferroelectric capacitors.

Although several embodiments of the invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention.

The invention claimed is:

1. A method for reading a non-volatile memory cell, comprising the steps of:
   activating an access transistor to connect a ferroelectric capacitor serially between a bit line and a drive line, said ferroelectric capacitor having a previously set polarization state;
   applying a drive pulse via said drive line to said ferroelectric capacitor for transferring a charge therefrom to said bit line, the amplitude of said transferred charge being a function of the polarization state of said ferroelectric capacitor, whereby a charge signal is established on said bit line, and wherein the amplitude of said charge signal is proportional to the charge transferred by the ferroelectric capacitor to the bit line;
   comparing said charge signal on said bit line with a reference signal and driving said bit line to either a high or low voltage state as determined by a difference between said charge signal and said reference signal; and restoring said previously set polarization state in said ferroelectric capacitor if the polarization state in said ferroelectric capacitor has been changed by said drive pulse, said step of restoring being carried out by a voltage between said bit line and said drive line thereby reestablishing an original polarization state in said memory cell.

2. A method for reading a non-volatile memory cell as recited in claim 1 wherein the step of comparing starts before a termination of said drive pulse.

3. The method as recited in claim 2, wherein the ferroelectric capacitor comprises a PLZT-based capacitor.

4. The method as recited in claim 2, wherein the ferroelectric capacitor comprises a PZT-based capacitor.

5. The method as recited in claim 2, wherein the ferroelectric capacitor comprises a $PbTiO_3$-based capacitor.

6. The method as recited in claim 2, wherein the ferroelectric capacitor comprises a $PbZrO_3$-based capacitor.

7. A method for reading a non-volatile memory cell as recited in claim 1 wherein the step of comparing starts after a termination of said drive pulse.

8. The method as recited in claim 7, wherein the ferroelectric capacitor comprises a PLZT-based capacitor.

9. The method as recited in claim 7, wherein the ferroelectric capacitor comprises a PZT-based capacitor.

10. The method as recited in claim 7, wherein the ferroelectric capacitor comprises a $PbTiO_3$-based capacitor.

11. The method as recited in claim 7, wherein the ferroelectric capacitor comprises a $PbZrO_3$-based capacitor.

12. The method as recited in claim 1, wherein the ferroelectric capacitor comprises a PLZT-based capacitor.

13. The method as recited in claim 1, wherein the ferroelectric capacitor comprises a PZT-based capacitor.

14. The method as recited in claim 1, wherein the ferroelectric capacitor comprises a $PbTiO_3$-based capacitor.

15. The method as recited in claim 1, wherein the ferroelectric capacitor comprises a $PbZrO_3$-based capacitor.

16. A nonvolatile method of reading data from and restoring data to a ferroelectric capacitor in a memory cell selected from an array, each memory cell including a respective ferroelectric capacitor and a switchable device located in the cell, where two polarization states of said capacitor correspond to two binary logic levels, comprising the steps of:

applying a signal to a word line to select a memory cell and turn on the switchable device located within the selected memory cell and thereby couple one plate of said capacitor to a bit line;

applying a non-zero voltage across the plate of said capacitor while said switchable device is turned on;

comparing the signal developed on a bit line to another signal thereby to determine the logic state of the data and terminating the non-zero voltage and the word line signal at different times; and applying a low voltage and a high voltage in a sequence to another plate of said ferroelectric capacitor while said switchable device is turned on, thereby restoring said capacitor to the polarization state prior to the read operation regardless of the logic state.

17. The method as recited in claim 16, wherein the ferroelectric capacitor comprises a PLZT-based capacitor.

18. The method as recited in claim 16, wherein the ferroelectric capacitor comprises a PZT-based capacitor.

19. The method as recited in claim 16, wherein the ferroelectric capacitor comprises a $PbTiO_3$-based capacitor.

20. The method as recited in claim 16, wherein the ferroelectric capacitor comprises a $PbZrO_3$-based capacitor.

* * * * *